(12) United States Patent
Yang

(10) Patent No.: US 7,733,737 B2
(45) Date of Patent: Jun. 8, 2010

(54) SEMICONDUCTOR MEMORY DEVICE USING BUS INVERSION SCHEME

(75) Inventor: Sun-Suk Yang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 84 days.

(21) Appl. No.: 12/150,670

(22) Filed: Apr. 30, 2008

(65) Prior Publication Data

US 2009/0116330 A1     May 7, 2009

(30) Foreign Application Priority Data

Nov. 2, 2007     (KR) ...................... 10-2007-0111529

(51) Int. Cl.
*G11C 8/00* (2006.01)
(52) U.S. Cl. .............................. 365/230.08; 365/233.1; 365/233.13
(58) Field of Classification Search ............ 365/230.08, 365/233.13, 233.1
See application file for complete search history.

(56) References Cited

U.S. PATENT DOCUMENTS 6,185,151 B1 *   2/2001   Cho ...................... 365/233.16

6,314,536 B1 *   11/2001   Kurosaki .................... 714/718

FOREIGN PATENT DOCUMENTS

KR     10-2007-0090447 A     9/2007

\* cited by examiner

*Primary Examiner*—Hoai V Ho
*Assistant Examiner*—Anthan T Tran
(74) *Attorney, Agent, or Firm*—Blakely, Sokoloff, Taylor & Zafman LLP

(57) ABSTRACT

A semiconductor memory device is capable of transferring address signals at high speed and improving the operation reliability even though an input rate of an address signal increases, and thus a degradation of an operation speed caused by applying a bus inversion scheme can be prevented and power consumption can be reduced. The semiconductor memory device includes a bus inversion decoding block configured to determine whether a plurality of address signals are inverted or not by decoding an indication control signal, and an address buffer block configured to receive two address signals per one cycle of an external clock, align the received address signals for parallel processing, and transfer the address signals or inverted address signals according to an output of the bus inversion decoding block.

10 Claims, 3 Drawing Sheets

SEMICONDUCTOR MEMORY DEVICE USING BUS INVERSION SCHEME

CROSS-REFERENCE TO RELATED APPLICATIONS

The present invention claims priority to Korean patent application number 10-2007-0111529, filed on Nov. 2, 2007 which is incorporated by reference in its entirety.

BACKGROUND OF THE INVENTION

The present invention relates to a high-speed semiconductor memory device, and more particularly to a semiconductor memory device operating with an address to which a bus inversion scheme is applied.

In a system with a variety of semiconductor devices, a semiconductor memory device serves as data storage. The semiconductor memory device outputs data corresponding to addresses received from a data processor, e.g., a central processing unit (CPU), or stores data received from the data processor into unit cells selected by addresses inputted together with the data.

As the operating speed of the system is increasing, the data processor requires the semiconductor memory device to input and output data at higher speed. To this end, internal circuits of the semiconductor memory device must be able to operate at high speed and transfer signals or data therebetween at high speed.

The operating speed of the semiconductor memory device can be increased by performing internal operations at higher speed or increasing the signal and data input/output speed. As one example, a double data rate (DDR) memory device can increase the data output speed by outputting data in synchronization with a falling edge as well as a rising edge of a system clock. Since the DDR memory device inputs and outputs two data per clock cycle via one input/output terminal in one cycle, its data input/output speed is faster than that of the existing semiconductor memory device. Recently, a semiconductor memory device capable of inputting or outputting four data in one cycle of a system clock was proposed. Although the data input/output speed of the semiconductor memory device is gradually increasing, an input/output speed of an address or command signal is unsatisfactory.

In a typical semiconductor memory device, an address is inputted together with an external operation command signal in synchronization with a rising edge of a clock. That is, the semiconductor memory device receives external address and operation command signal in synchronization with a rising edge of an external clock and performs an internal operation. However, as the operating speed of the semiconductor memory device is increasing, an address can be inputted two times in one cycle of the system clock.

Graphics double data rate version 5 (GDDR5) memory devices for graphic works are designed to receive addresses at a rising edge and a falling edge of an external clock. That is, the GDDR5 memory devices can receive the addresses two times in one cycle of the external clock. Thus, compared with the typical semiconductor memory device, the number of address pins is reduced or the operating speed can be increased by connecting extra pins to a power voltage terminal or a ground terminal. Since an external operation command signal is still inputted in synchronization with a rising edge of an external clock, the address input speed is two times faster than a command input speed.

Since the addresses are inputted two times in one cycle of the external clock, the address transition increases two times and a voltage toggling often occurs at the address input port, causing a lot of current consumption. As one example, a swing width of an address signal can be defined in a range from VIH(Vref+0.12V) at a logic high level to VIL(Vref−0.12V) at a logic low level. Therefore, if the transitions occur two times more than the conventional art, the power consumption will also increase.

As the signal input speed increases in the same time, a bus inversion scheme is applied to the semiconductor memory device in preparation for the increasing transitions. According to the bus inversion scheme, a previously transmitted value and a current value to be transmitted are compared with each other. When transitions occur more than half of a total bit number to be transferred, a signal transmitter transmits an inverted value of the current value to be transmitted, and a signal receiver recognizes the current value by inverting the received signal. On the other hand, when transitions occur less than half of the total bit number, the signal transmitter transmits the current value and the signal receiver recognizes the received signal as it is. At this point, the signal transmitter and the signal receiver additionally transmit indication control signals indicating whether they transmit the current value or its inverted value.

A case where the bus inversion scheme is applied to 8-bit bus will be described in more detail. For example, assuming that "00011100" is a previously transmitted signal and "00001010" is a current value to be transmitted, a transition should occur at 3 bits. In this case, since three bits of the total eight bits have only to be changed, the signal transmitter transmits the current value to be transmitted. If a value to be newly transmitted after the transmission of "00001010" is "11100111", transmission should occur at six bits. In this case, transitions occur more than half of the total eight bits, thus increasing the power consumption. Therefore, using the bus inversion scheme, the signal transmitter inverts the values "11100111" to be transmitted, and transmits "00011000". The signal transmitter activates the indication control signal and indicates that the transmitted value is the inverted value. In this manner, compared with the previously transmitted value "00001010", transitions occur at 2 bits of the eight bits. Consequently, the power consumption can be reduced, compared with the case where the transitions occur at six bits.

If such a bus inversion scheme is applied to multi-bit address signals inputted from the outside, an address input rate is increasing and the power consumption is reduced. However, when carrying out the bus inversion scheme, an operation speed may be lowered, or an operation margin for internal operation may be reduced, degrading the whole operation stability of the semiconductor memory device. In particular, if a delay occurs in the input of the address signal, an operation of reading data from or writing data to a cell corresponding to an address signal becomes slow, degrading the performance of the semiconductor memory device.

SUMMARY OF THE INVENTION

Embodiments of the present invention are directed to providing a high-speed semiconductor memory device capable of transferring address signals at high speed and improving the operation reliability. Even though an input rate of an address signal increases, a setup/hold time necessary to receive the address signal can be sufficiently ensured. Thus, a degradation of an operation speed caused by applying a bus inversion scheme can be prevented and power consumption can be reduced.

In accordance with an aspect of the present invention, there is provided a semiconductor memory device for including a bus inversion decoding block configured to determine whether a plurality of address signals are inverted or not by decoding an indication control signal, and an address buffer block configured to receive two address signals per one cycle of an external clock, align the received address signals for parallel processing, and transfer the address signals or inverted address signals according to an output of the bus inversion decoding block.

In accordance with another aspect of the present invention, there is provided a system for including a data processor configured to compare previous address signal with current address signal respectively, and output the current address signals or inverted current address signals as address signals according to the comparison result together with a command signal, and a semiconductor memory device configured to ensure a setup/hold time by aligning the address signals for parallel processing, and perform an operation corresponding to the command signal by transferring the address signals according to an inversion information of the address signals using indication control signals indicating the invention information.

In implementing an address bus inversion (ABI) scheme by applying a bus inversion scheme to an address in order for increased operation speed and reduced power consumption, a pulse capable of ensuring an operation margin of an address buffer is generated by using an indication control signal for ensuring the reliability in a latching operation of an address signal. The use of this pulse can prevent a degradation of a setup/hold time at an input port caused by the increase of the input rate of the address signal. Furthermore, the semiconductor memory device can stably receive the address signal, while preventing the degradation of the operation speed. Moreover, the pulse generator can be designed without great modification of the existing input buffer and latch, thereby ensuring the operation stability of the semiconductor memory device.

DESCRIPTION OF SPECIFIC EMBODIMENTS

Hereinafter, a semiconductor memory device using a bus inversion scheme in accordance with the present invention will be described in detail with reference to the accompanying drawings.

Figure 1:
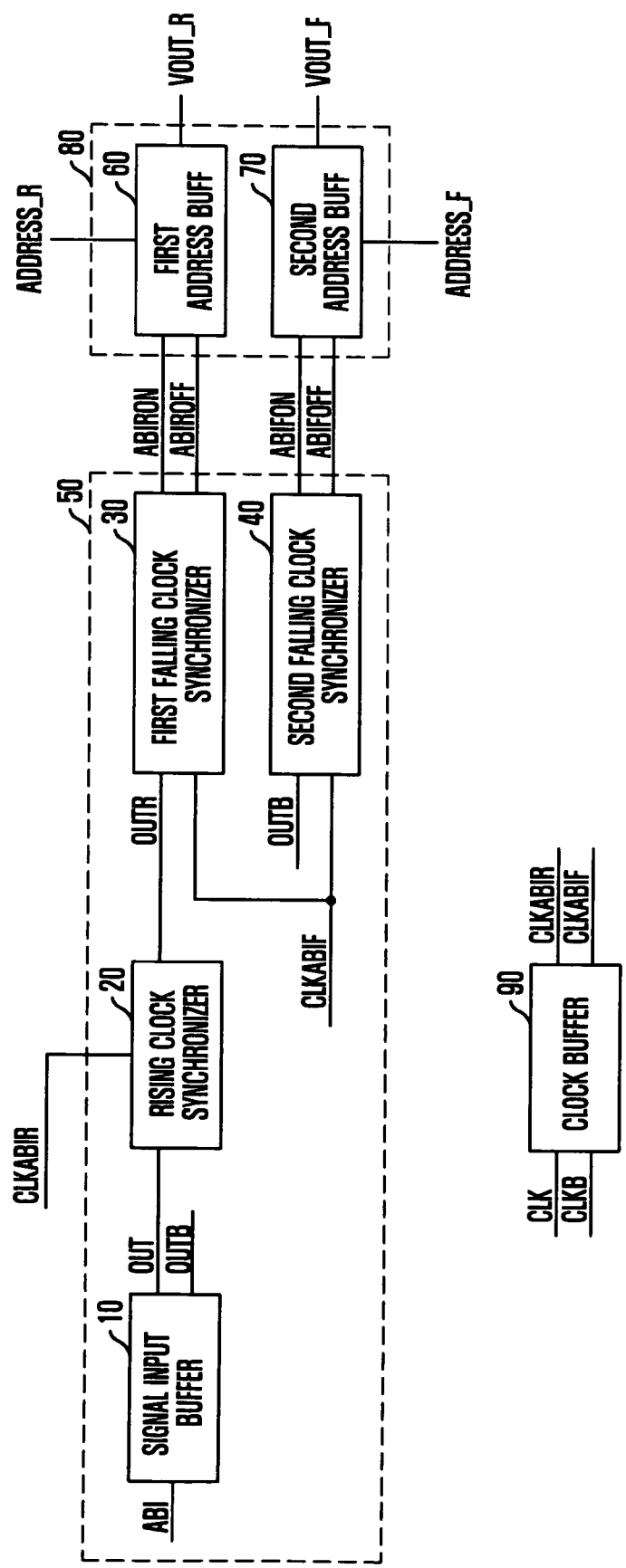
FIG. 1 is a block diagram of a semiconductor memory device in accordance with an embodiment of the present invention.

FIG. 1 is a block diagram of a semiconductor memory device in accordance with an embodiment of the present invention.

Referring to FIG. 1, the semiconductor memory device includes a bus inversion decoding block 50 and an address buffer block 80. The bus inversion decoding block 50 includes a signal input buffer 10, a rising clock synchronizer 20, and first and second falling clock synchronizers 30 and 40. The bus inversion decoding block 50 decodes an indication control signal ABI and controls the address bus block 80. The address buffer block 80 includes first and second address buffers 60 and 70. The address buffer block 80 transfers addresses according to a control signal outputted from the bus inversion decoding unit 50.

The signal input buffer 10 receives the indication control signal ABI from the outside. The indication control signal ABI indicates whether the inputted address signal has an original value or an inverted value according to the address bus inversion scheme. The indication control signal ABI inputted to the signal input buffer 10 is outputted as an indication signal OUT and a complementary indication signal OUTB. When the indication control signal ABI is at a logic low level, the indication signal OUT has a ground voltage level VSS and the complementary indication signal OUTB has a power supply voltage level VDD.

The indication signal OUT is inputted to the rising clock synchronizer 20. The rising clock synchronizer 20 latches the indication signal OUT using an internal rising clock CLKABIR synchronized with a rising edge of an external clock CLK. Thus, the indication signal OUT becomes a rising indication signal OUTR synchronized with the rising edge of the external clock. The rising indication signal OUTR from the rising clock synchronizer 20 and the complementary indication signal OUTB from the signal input buffer 10 are inputted to the first falling clock synchronizer 30 and the second falling clock synchronizer 40, respectively.

Like the rising clock synchronizer 20, the first and second falling clock synchronizers 30 and 40 latches the rising indication signal OUTR and the complementary indication signal OUTB using an internal falling clock CLKABIF synchronized with a falling edge of the external clock CLK. Thus, the rising indication signal OUTR and the complementary indication signal OUTB are synchronized with the falling edge of the external clock CLK. Thereafter, the first falling clock synchronizer 30 outputs a rising inversion enable signal ABIRON and a rising inversion disable signal ABIROFF synchronized with the falling edge of the external clock CLK according to a value of the rising indication signal OUTR. The second falling clock synchronizer 40 outputs a falling inversion enable signal ABIFON and a falling inversion disable signal ABIFOFF synchronized with the falling edge of the external clock CLK according to a value of the complementary indication signal OUTB.

The internal rising clock CLKABIR and the internal falling clock CLKABIF are generated by a clock buffer 90. The clock buffer 90 receives the external clock CLK and an inverted external clock, i.e. an external complementary clock, CLKB and outputs the internal rising clock CLKABIR synchronized with the rising edge of the external clock CLK and the internal falling clock CLKABIF synchronized with the falling edge of the external clock CLK. In order to generate the internal signals synchronized with the rising edge and the falling edge of the external clock CLK, a phase of the external clock CLK may be divided, or an inverted external clock may be used. Alternatively, an external clock and its inverted clock independently inputted from the outside may be used.

The rising inversion enable signal ABIRON and the rising inversion disable signal ABIROFF, which are outputted from the first falling clock synchronizer 30, are inputted to the first address buffer 60. The rising inversion enable signal ABIRON and the rising inversion disable signal ABIROFF are used for determining whether to buffer the address inputted in synchronization with the rising clock of the external clock CLK, or the inverted value of the inputted address. In a similar manner, the second address buffer 70 buffers the address inputted in synchronization with the falling clock of the external clock CLK, or the inverted value of the inputted address according to the falling inversion enable signal ABIFON and the falling inversion disable signal ABIFOFF.

Figure 2:
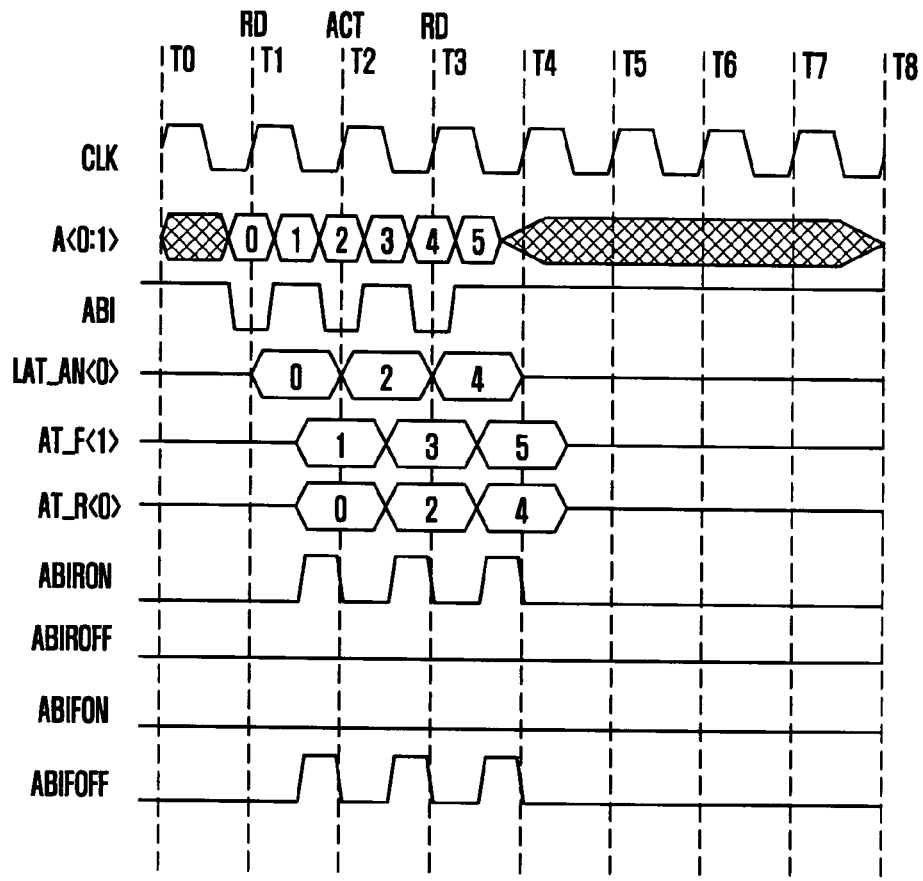
FIG. 2 is a signal timing diagram illustrating the operation of the semiconductor memory device of FIG. 1.

FIG. 2 is a signal timing diagram illustrating the operation of the semiconductor memory device of FIG. 1.

Referring to FIG. 2, the semiconductor memory device in accordance with the embodiment of the present invention receives two addresses A<0:1> from one address input port in one cycle of the external clock CLK. That is, a 2-bit address signal is inputted through one pad (address pin). In addition, the indication control signal ABI is also inputted with the address signal. It is assumed in FIG. 2 that the indication control signal ABI of "L, H, L, H, L, H" is inputted with six successive addresses. This means that $0^{th}$, $2^{nd}$ and $4^{th}$ addresses of the six successive addresses are inverted signals, and $1^{st}$, $3^{rd}$ and $5^{th}$ addresses are original signals.

The $0^{th}$ address inputted at the rising edge of the external clock CLK is first latched (LAT_AN<0>). Then, the $1^{st}$ address inputted at the falling edge of the external clock CLK and the latched $0^{th}$ address are latched at the falling edge of the external clock CLK (AT_F<1> and AT_R<0>). That is, two addresses inputted through one address pin in one cycle of the external clock CLK are latched in parallel. Thus, as illustrated in FIG. 1, the two addresses are inputted to the first and second address buffers 60 and 70, respectively.

The first and second address buffers 60 and 70 receive the $0^{th}$ and $1^{st}$ addresses and output the addresses or the inverted addresses according to the rising inversion enable signal ABIRON, the rising inversion disable signal ABIROFF, the falling inversion enable signal ABIFON, and the falling inversion disable signal ABIFOFF, which are outputted by decoding the indication control signal ABI. In FIG. 2, since the $0^{th}$ address is the inverted address signal, the inputted address should be again inverted. Thus, the rising inversion enable signal ABIRON is activated to a logic high level and the inputted address is inverted. Since the $1^{st}$ address is the original address signal, the falling inversion disable signal ABIFOFF is activated and the inputted address is transferred as it is.

Figure 3:
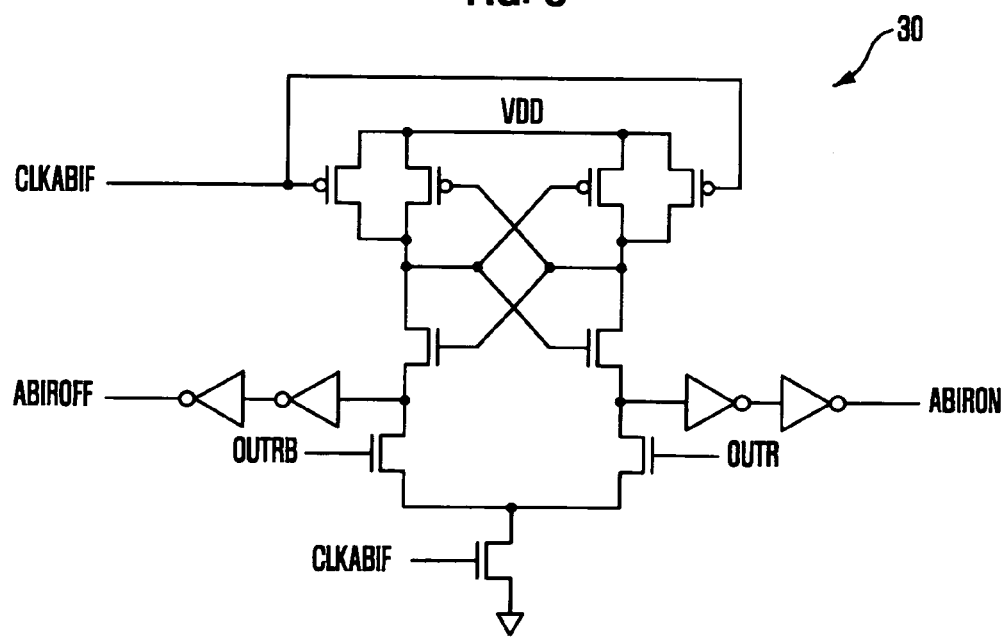
FIG. 3 is a schematic circuit diagram of a first falling clock synchronizer of FIG. 1.

FIG. 3 is a schematic circuit diagram of the first falling clock synchronizer 30 of FIG. 1.

Referring to FIG. 3, the first falling clock synchronizer 30 is designed based on a cross-coupled latch. When the rising indication signal OUTR is a logic high level, the rising inversion disable signal ABIROFF is activated in synchronization with the internal falling clock CLKABIF. The internal falling clock CLKABIF is outputted from the clock buffer 90 in synchronization with the falling edge of the external clock CLK. On the other hand, when the inverted signal OUTRB of the rising indication signal OUTR is a logic high level, that is, the rising indication signal OUTR is a logic low level, the rising inversion enable signal ABIRON is activated.

Although the internal configuration of the first falling clock synchronizer 30 is illustrated in FIG. 3, the rising clock synchronizer 20 and the second falling clock synchronizer 40 can also be designed the same as the configuration of FIG. 3, except the inputted signals. In the case of the rising clock synchronizer 20, the indication signal OUT from the signal input buffer 10 can be latched in synchronization with the internal rising clock CLKABIR, which is synchronized with the rising edge of the external clock CLK, and then outputted as the rising indication signal OUTR.

Figure 4A:
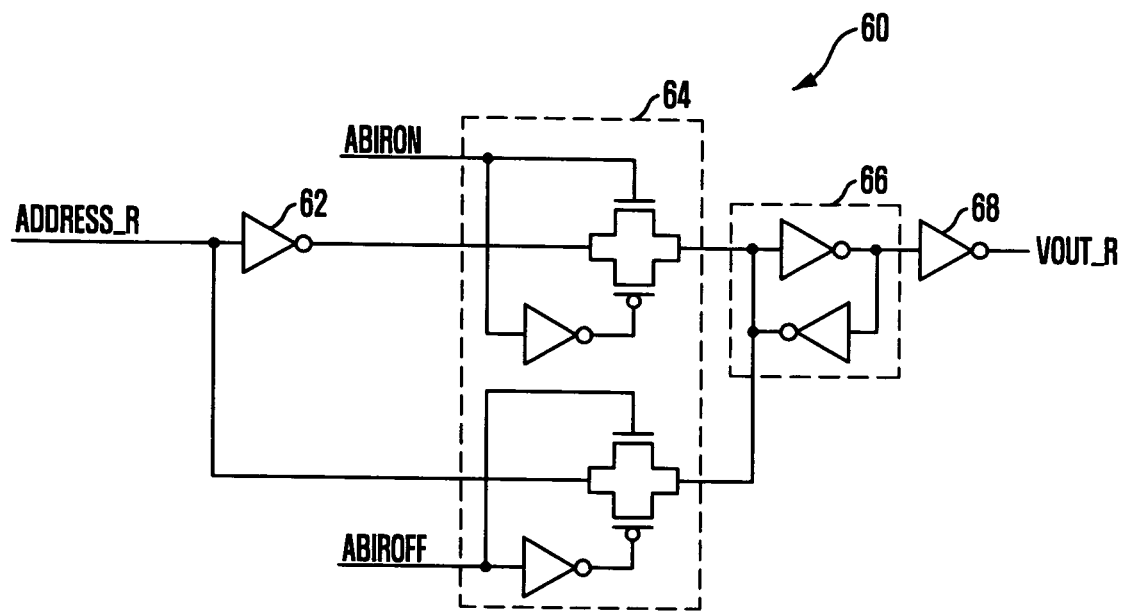
FIG. 4A is a schematic circuit diagram of a first address buffer of FIG. 1.
Figure 4B:
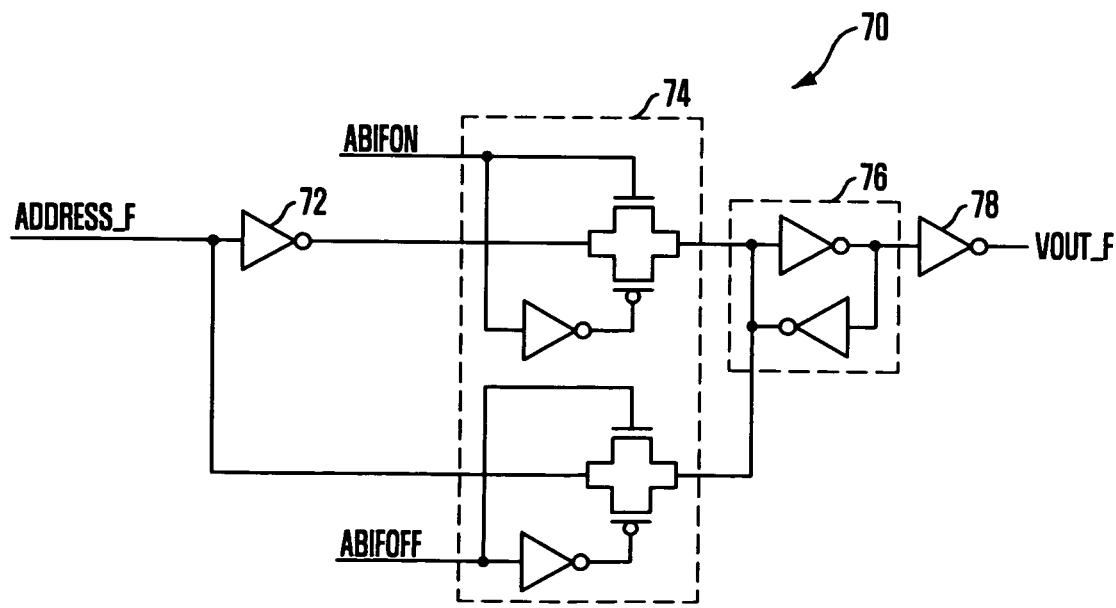
FIG. 4B is a schematic circuit diagram of a second address buffer of FIG. 1.

FIG. 4A is a schematic circuit diagram of the first address buffer 60 of FIG. 1, and FIG. 4B is a schematic circuit diagram of the second address buffer 70 of FIG. 1. The first and second address buffers 60 and 70 may have the same configurations, except the inputted signals.

Referring to FIG. 4A, the first address buffer 60 includes a first inverter 62, an address transfer unit 64, a latch 66, and a second inverter 68. The first inverter 62 is configured to invert a rising address ADDRESS_R inputted in synchronization with the rising edge of the external clock CLK. The address transfer unit 64 is configured to transfer an output of the first inverter 62 or the rising address ADDRESS_R. The latch 66 is configured to latch an output of the address transfer unit 64. The second inverter 68 is configured to inverter an output of the latch 64. More specifically, the address transfer unit 64 includes two transfer gates that are controlled by the rising inversion enable signal ABIRON and the rising inversion disable signal ABIROFF. The address transfer unit 64 transfers the rising address ADDRESS_R or its inverted address according to the logic level of the indication control signal ABI.

The second address buffer 70 of FIG. 4B is implemented with the same configuration as the first address buffer 60. However, in the case of the second address buffer 70, a falling address ADDRESS_F is inputted in synchronization with the falling edge of the external clock CLK, and the address transfer unit 74 is controlled by the falling inversion enable signal ABIFON and the falling inversion disable signal ABIFOFF. Since the inverters 72 and 78 and the latch 76 of FIG. 4B have the same functions as those of FIG. 4A, their detailed description will be omitted.

As described above, the semiconductor memory device in accordance with the embodiment of the present invention can use the existing latch circuit and buffer circuit to control the input of the addresses. Thus, even though the input rate of the address signal increases two times, the setup/hold time in the address input is not influenced.

Furthermore, since the inputted address signal is synchronized with the external clock CLK, it is recognized as having a valid window of 1 tCK in view of the internal circuit. Consequently, since both the latched address and its inverted address have the valid window of 1 tCK even based on the indication control signal ABI, it is very advantageous to ensuring the setup/hold time in the address input. Accordingly, even though the inputted value is changed by the indication control signal ABI, the address finally transferred to the internal circuit does not have an additional delay. When used in the general operations (e.g., operations by active/read/write commands), they can ensure the operation margin.

As described above, in high-speed semiconductor memory devices that receive two addresses in one cycle of an external clock and can reduce power consumption using a bus inversion scheme, a skew that may occur in an address input can be minimized and a setup/hold time can be ensured in accordance with the present invention.

Furthermore, in an operation of transferring an inputted address signal or its inverted signal according a bus inversion scheme, an operation delay can be eliminated compared with an existing address transfer operation, thereby ensuring a high-speed operation of a semiconductor memory device without affecting the operation margin necessary for the read and write operations.

Moreover, since the bus inversion scheme is applied to the address signal without additional delay, the power consumption is reduced and the number of the address pins is reduced. By connecting extra pins to a power supply voltage or a ground voltage, the operation speed of the semiconductor memory device can be increased.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a bus inversion decoding block configured to determine whether a plurality of address signals are inverted or not by decoding an indication control signal to one of a first logic level and a second logic level; and
an address buffer block configured to receive two address signals per one cycle of an external clock, align the received address signals for parallel processing, and transfer the address signals when the indication control signal is decoded to the first logic level and transfer the inverted address signals when the indication control is decoded to the second logic level.

2. The semiconductor memory device as recited in claim 1, wherein the bus inversion decoding block parallel-processes two of said indication control signals inputted in one cycle of the external clock, and outputs a plurality of decoding result signals synchronized with falling edges of the external clock to the address buffer block.

3. The semiconductor memory device as recited in claim 2, wherein each of the indication control signals is a 1-bit successively inputted signal, and is inputted in synchronization with the plurality of address signals to indicate the inversion or not in the corresponding address signal.

4. The semiconductor memory device as recited in claim 2, wherein the bus inversion decoding block includes:
a signal input buffer configured to receive each indication control signal to generate a plurality of indication signals having opposite phases;
a rising clock synchronizer configured to synchronize one of the plurality of indication signals with a rising edge of the external clock;
a first falling clock synchronizer configured to synchronize an output of the rising clock synchronizer with the falling edge of the external clock and control a rising address signal inputted in synchronization with the rising edge of the external clock; and
a second falling clock synchronizer configured to synchronize another indication signal with the falling edge of the external clock and control a falling address signal inputted in synchronization with the falling edge of the external clock.

5. The semiconductor memory device as recited in claim 4, further including a clock buffer configured to receive the external clock, generate an internal rising clock to the rising clock synchronizer in synchronization with the rising edge of the external clock, and generate an internal falling clock to the first and second falling clock synchronizers in synchronization with the falling edge of the external clock.

6. The semiconductor memory device as recited in claim 4, wherein the rising clock synchronizer, the first falling clock synchronizer, and the second falling clock synchronizer are implemented with the same components with the exception of input signals.

7. The semiconductor memory device as recited in claim 4, wherein the first clock synchronizer includes a cross-coupled latch.

8. The semiconductor memory device as recited in claim 4, wherein the address buffer block includes:
a first address buffer configured to receive the rising address signal to generate an inverted rising address signal, and transfer the rising address signal or the inverted rising address signal according to the output of the first falling clock synchronizer; and
a second address buffer configured to receive the falling address signal to generate an inverted falling address signal, and transfer the falling address signal or the inverted falling address signal according to the output of the second falling clock synchronizer.

9. The semiconductor memory device as recited in claim 8, wherein the first address buffer includes:
a first inverter configured to invert the rising address signal;
a transfer unit configured to transfer one of an output of the first inverter and the rising address signal according to the output of the first falling clock synchronizer;
a latch configured to latch an output of the transfer unit; and
a second inverter configured to invert an output of the latch.

10. The semiconductor memory device as recited in claim 9, wherein the second address buffer is implemented with the same components as the first address buffer with the exception of input signals.

* * * * *